United States Patent [19]

Takahashi et al.

[11] Patent Number: 5,280,246
[45] Date of Patent: Jan. 18, 1994

[54] NUCLEAR MAGNETIC RESONANCE APPARATUS

[75] Inventors: Tetsuhiko Takahashi, Souka; Etsuji Yamamoto, Akishima; Yoshikuni Matsunaga, Hachiouji; Ryuichi Suzuki, Kokubunji, all of Japan

[73] Assignees: Hitachi, Ltd.; Hitachi Medical Corporation, both of Tokyo, Japan

[21] Appl. No.: 793,456

[22] Filed: Nov. 18, 1991

[30] Foreign Application Priority Data

Nov. 16, 1990 [JP] Japan .................. 2-308912
Mar. 6, 1991 [JP] Japan .................. 3-39837
Mar. 12, 1991 [JP] Japan .................. 3-72436
Aug. 9, 1991 [JP] Japan .................. 3-200255

[51] Int. Cl.⁵ ............................................. G01V 3/00
[52] U.S. Cl. ...................................... 324/322; 324/318; 128/653.5
[58] Field of Search ............... 324/300, 307, 309, 318, 324/322; 128/653.5

[56] References Cited

U.S. PATENT DOCUMENTS

| 4,825,162 | 4/1989 | Roemer et al. | 324/318 |
| 5,086,275 | 2/1992 | Roemer | 324/322 |
| 5,144,243 | 9/1992 | Nakabayashi et al. | 324/318 |
| 5,160,891 | 11/1992 | Keren | 324/322 |

Primary Examiner—Louis Arana
Attorney, Agent, or Firm—Antonelli, Terry Stout & Kraus

[57] ABSTRACT

A nuclear magnetic resonance apparatus receives nuclear magnetic resonance signals from an object under test with an RF probe which is an array of coils, implements down-frequency conversion with frequency converters for the received signals in multiple channels such that the frequency bands of the converted signals do not virtually overlap, filters the converted signals with band pass filters each operating to cut off frequency bands of other channels, hybridizes the filtered signals of multiple channels to form a hybridized signal, and produces an image from the hybridized signal.

28 Claims, 9 Drawing Sheets

NUCLEAR MAGNETIC RESONANCE APPARATUS

BACKGROUND OF THE INVENTION

The present invention relates to a nuclear magnetic resonance apparatus which measures the nuclear magnetic resonance (will he termed "NMR" hereinafter) signals from hydrogen, phosphor, etc. in an object under test thereby to image the density distribution, relaxation time distribution, and the like of the nuclei.

Conventional NMR apparatus intended for the inspection and imaging of objects (e.g., human body) use various wrap coils specialized for the regions of interest, e.g., head and abdomen, and surface coils which are less affected by the movement of organ such as the heart. The surface coil has a higher sensitivity as compared with the head coil and abdomen coil, but it suffers from a limited view field, and therefore imaging of such a large section as the spine is carried out dividedly by shifting the position of the surface coil, resulting in a significant time consumption.

This problem is counterplotted by a method of virtually expanding the view field, as described in U.S. Pat. No. 4,825,162, in which a plurality of surface coils are arranged, with adjoining coils overlapping properly so that they do not couple, and the NMR signals received by the surface coils are hybridized. Although the arrangement of multiple surface coils overcomes the prior art deficiency of a narrow measuring view field, the advantage of the surface coil, i.e., high signal-to-noise (s/n) ratio, will be lost if the coil outputs are simply hybridized. A magnetic resonance apparatus described in U.S. Pat. No. 4,943,775 and another one described in publication "Magnetic Resonance in Medicine", Vol. 16, pp.192-225 published in 1990 are intended to achieve a wide view field as the whole and a high s/n ratio by rendering the quadrature phase detection and A/D conversion for the individual coil outputs before the signals are hybridized.

SUMMARY OF THE INVENTION

The conventional technique necessitates signal processing systems, each including a quadrature phase detector and an A/D converter, for the individual coil outputs in order to achieve an enhanced s/n ratio resulting unfavorably in a complex, bulky and expensive apparatus. Using a single signal processing system for processing multiple coil outputs on a time division basis incurs a prolonged measuring time. Although adjoining coils can be prevented from having a mutual coupling through their overlap arrangement, distant coils still have mutual couplings. It was revealed that the mutual coupling of coils causes the emergence of multiple peaks in the resonance characteristics of the coils and the degradation of s/n ratio of the coil outputs.

It is an object of the present invention to provide a magnetic resonance apparatus based on the hybridizing of multiple coil outputs which is simple in the structure of signal processing system and operative at an enhanced s/n ratio.

Another object of the present invention is to improve s/n ratio of an RF (radio frequency) probe itself, which is constituted by an array of coils.

Still another object of the present invention is to provide an RF probe, which is constituted by an array of coils, suitable for the magnetic resonance apparatus of the vertical magnetic field type.

In order to achieve the above objectives, the present invention resides in a magnetic resonance apparatus in which, as a principal feature, bio-RF signals of multiple channels produced by an RF probe are amplified by individual amplifiers, the amplified signals, are converted into signals of multiple frequency bands which do not virtually overlap by frequency converters, the resulting signals are filtered by individual band-pass filters and finally the filtered signals are hybridized. Because of the filtering of signals after conversion into separate frequency bands, the band-pass filter of each channel can cut off the signal frequency band of other channels, enabling ensured noise separation for individual channels. On this account, hybridizing the signals, even if it is based on the analog summation, does not deteriorate the s/n ratio.

As another feature of the present invention, the RF signals which have been amplified by the individual amplifiers are converted into low-frequency signals by first-stage frequency converters, the resulting signals are filtered by individual band-pass filters, the filtered signals are converted into signals with frequencies of different bands by second-stage frequency converters, and finally the signals are hybridized. This arrangement, in which filtering takes place after the RF signals have been converted into low-frequency bands, can sharply cut off noise components outside the signal frequency bands.

Other features of this invention will become apparent from the following description of the specific embodiments.

DESCRIPTION OF THE PREFERRED EMBODIMENTS

An embodiment of the present invention will be explained in detail with reference to FIG. 1 through FIG. 4. This embodiment is designed such that the NMR signals from an object under test in frequency bands of a first group collected by a multi-channel RF probe ar amplified by corresponding amplifiers, the amplified signals are converted into low-frequency signals in frequency bands of a second group by first frequency converters such that all signal frequency bands do not virtually overlap, the signals of the secondary frequency bands are filtered by band-pass filters, and finally the resulting signals are hybridized. The signals of the second frequency band group have a center frequency interval set greater than that of the signals of the first frequency band group.

Figure 1:
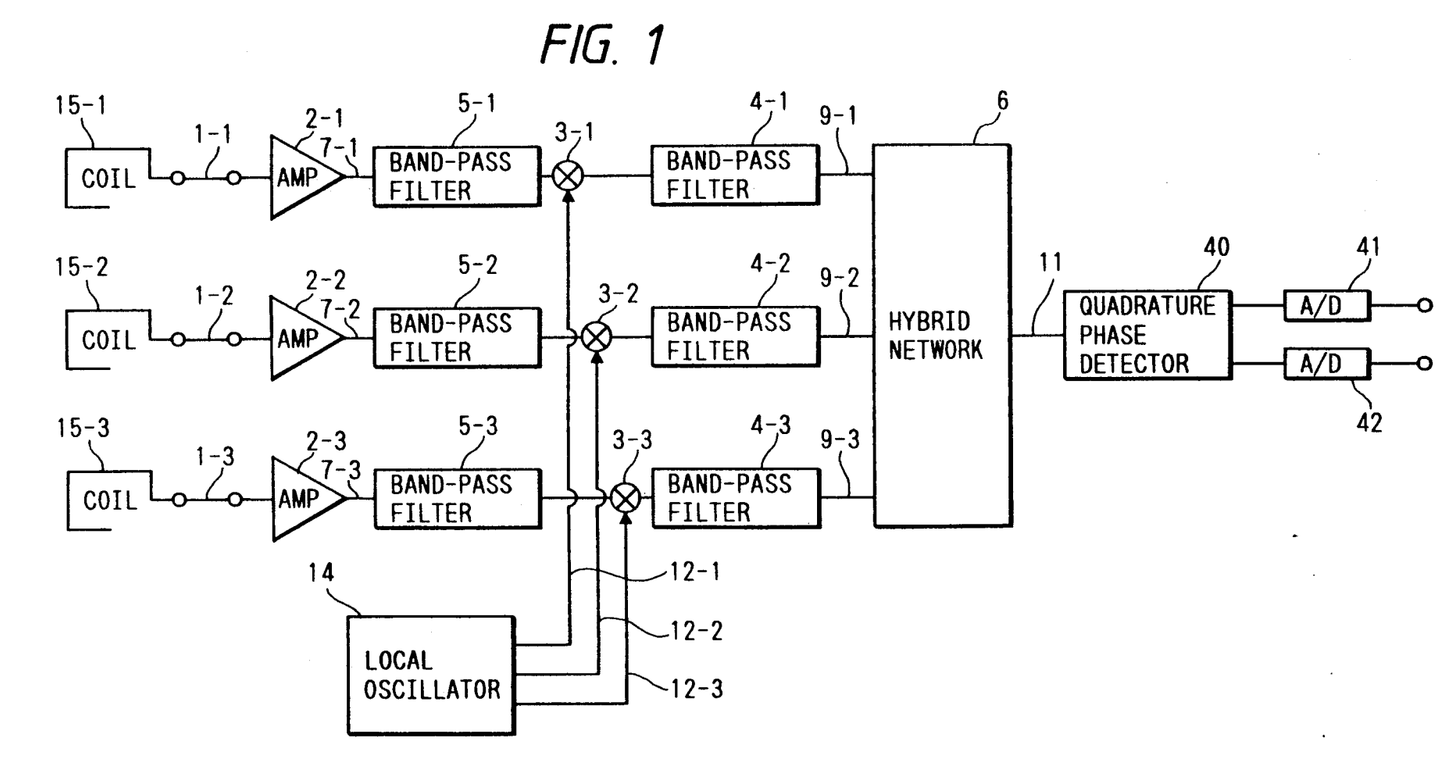
FIG. 1 is a block diagram showing the principal portions of the first embodiment of this invention.
Figure 2:
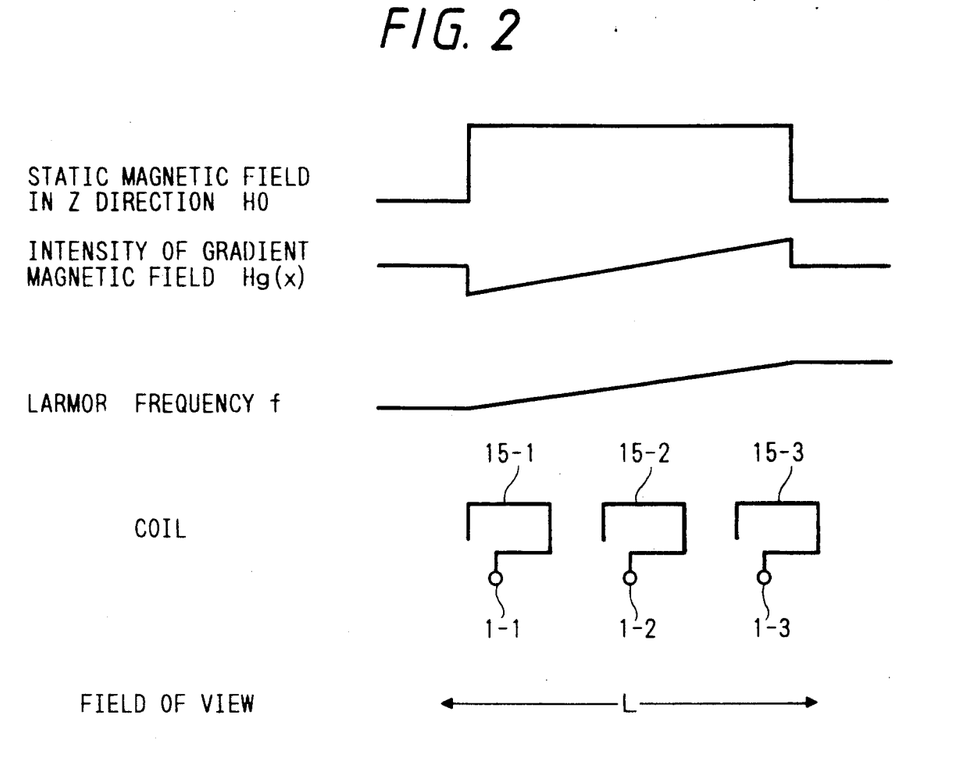
FIG. 2 is a conceptual diagram showing the frequency of each coil output.

FIG. 1 shows the circuit which receives three output signals 1-1, 1-2 and 1-3 simultaneously from an RF probe and hybridizes the signals. The RF probe of the magnetic resonance apparatus comprises coils 15-1, 15-2 and 15-3 which produce the output signals 1-1, 1-2 and 1-3 of a primary signal frequency that is exactly equal to the Larmor frequency of the atomic nucleus of the object. The Larmor frequency is determined from the intensity of magnetic field of the magnetic resonance apparatus and the atomic nucleus in attention in the object, and it will be explained on FIG. 2. In the case of a magnetic resonance apparatus of the vertical magnetic field type for example, the intensity of magnetic field is the sum of the intensity of a static magnetic field $H_0$ (it is assumed to be in the z direction) and the intensity of a gradient magnetic field $Hg(x)$ which produces a z-direction magnetic field having an intensity distribution along the x direction orthogonal to the static magnetic field. The larmor frequency f is given as follows.

$$f = \gamma(Hg(x)+H_0)2\pi \qquad (1)$$

where $\gamma$ is the gyromagnetic ratio specific to an atomic nucleus, and for proton it is 267 MHz/T. The $Hg(x)$ has a constant gradient $\alpha$, with the view field center being set to zero for example, and it ranges from 0.1 mT/m to 10 mT/m (or 0.01 G/cm to 1 G/cm), approximately. For a view field L in the x direction, the band width $\Delta f$ of the detected NMR signal is given as follows.

$$\Delta f = \gamma \alpha L / 2\pi \qquad (2)$$

Accordingly, in detecting proton by using a relatively weak gradient magnetic field of 0.5 mT/m in the presence of a static magnetic field of 0.2 T and with an imaging view field of 0.6 m from +0.3 m to −0.3 m, for example, the NMR signal will have a bandwidth of 12.75 kHz centered at 8.5 MHz. In imaging an object by dividing the view field equally into three sections with surface coils 15-1, 15-2 and 15-3, as shown in FIG. 2, the signals 1-1, 1-2 and 1-3 from these coils have their center frequencies evaluated from the formula (1) to be 8.4957 MHz, 8.50000 MHz and 8.50425 MHz, respectively. Their bandwidth is 4.25 kHz as evaluated from the formula (2). Namely, the intensity of gradient magnetic field differs depending on the space of signal detection of each coil, and accordingly the frequency of RF signal to be detected and the primary frequency differ slightly among the coils.

Although the foregoing is the case of a vertical magnetic field, the frequencies of detected signals in the case of a horizontal magnetic field can be explained similarly.

Returning to FIG. 1, the output signals 1-1, 1-2 and 1-3 are amplified by the respective amplifiers 2-1, 2-2 and 2-3 having a gain of 20 dB to 50 dB typically. The amplified signals 7-1, 7-2 and 7-3 are fed to the respective band-pass filters 5-1, 5-2 and 5-3, by which noises with frequencies outside the respective signal frequency bands are eliminated. The filters are designed to have the attenuation of 20 dB or more at 8.4 MHz or lower, and their attenuating characteristics for the high frequency side may be more moderate. The band-pass filters may be replaced with high-pass filters.

The signals coming out of the band-pass filters 5-1, 5-2 and 5-3 are fed to the respective frequency converters 3-1, 3-2 and 3-3, and converted to secondary signal frequencies. The secondary signal frequencies have a close relation with the bands of the latter-stage band-pass filters 4-1, 4-2 and 4-3, and these frequencies are set lower so that the filtering bands can be treated easily, according to this invention. As an example, a local oscillator 14 is designed to produce outputs 12-1, 12-2 and 12-3 of 7.40000 MHz, 7.30000 MHz and 7.20000 MHz, respectively, and these reference signals are mixed to the object signals by the frequency converters 3-1, 3-2 and 3-3, resulting in low-frequency signals of 1.09575 MHz, 1.20000 MHz and 1.30425 MHz, respectively.

The band-pass filters 4-1, 4-2 and 4-3 remove signal components outside the respective signal frequency bands from the output signals of the frequency converters. High frequency components of about 16 MHz emerging in this process are greatly different from the signal frequencies of about 1 MHz, and they can readily be eliminated by the band-pass filters 4-1, 4-2 and 4-3. Another stage of low-pass filters (not shown) may be used when necessary. This noise elimination is to cut off the frequency bands of signals of other coils.

The output signals 9-1, 9-2 and 9-3 coming out of the band-pass filters 4-1, 4-2 and 4-3 have the same band width as of the signals 1-1, 1-2 and 1-3, and it is 4.25 kHz as evaluated by the formula (2). However, the output signals have been converted to frequencies lower than the signals 1-1, 1-2 and 1-3, and, in addition, their center frequency interval 104.25 kHz is greater than that (4.25 kHz) of the primary signals. On this account, band-pass filters with moderate cutoff characteristics (a 100 kHz separation suffices for 1 MHz) can be used for each channel to remove frequency bands of other coils together.

The band-pass filter has a Q-value which derives from $f/\Delta f$, where f is the center frequency and $\Delta f$ is the band width. This value is evaluated for this embodiment as:

$$Q = 1 \text{ MHz}/104.25 \text{ kHz} \approx 10 \qquad (3)$$

Figure 3:
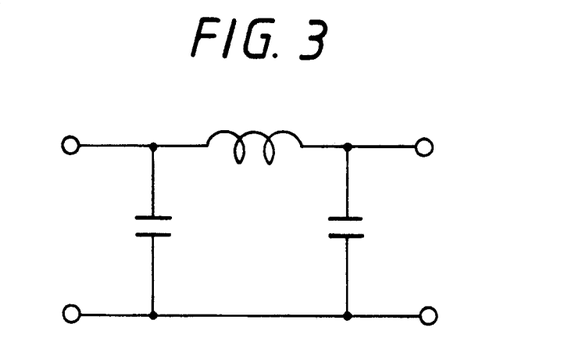
FIG. 3 is a schematic diagram of the band-pass filter based on the embodiment of this invention.

This filter characteristics can readily be attained by the known technique, e.g., a band-pass filter circuit shown in FIG. 3.

Although the secondary frequency is set to about 1 MHz in this embodiment, it can be varied within the scope of the substantial matter of this invention, e.g., it can be lowered down to about 20 kHz and in this case the filter characteristics can be more moderate and thus easier to practice.

Returning again to FIG. 1, the filtered signals 9-1, 9-2 and 9-3 of the secondary frequencies coming out of the band-pass filters 4-1, 4-2 and 4-3 are hybridized by the hybrid network 6, which produces a signal 11 with a frequency band from about 1 MHz to 1.3 MHz. The hybridized signal has a sufficiently small amount of noise components per frequency, and hybridizing the signals does not amplify the noise. The reason is that the individual signals 9-1, 9-2 and 9-3 to be hybridized have already been rid of unwanted frequency components by the band-pass filters 4-1, 4-2 and 4-3. Accordingly, the signals may be hybridized based on the analog summation, and the resulting s/n ratio is still satisfactory.

In the illustrated example, the hybridized signal 11 is fed to the quadrature phase detector 40, performing the orthogonal phase detection and the resulting real part and imaginary part outputs are converted into digital signals by the respective A/D converters 41 and 42. The quadrature phase detector uses two reference signals with a 90° phase difference, with their frequency being set virtually equal to the center frequency of the frequency band of the signal 11, i.e., it is 1.2 MHz in this embodiment.

The resulting two digital signals are transformed by the complex Fourier transformation. These signals of different channels can be separated based on their phase difference. The two A/D converters may be replaced with a single A/D converter which deals with the hybridized signal 11. Also in this case, the signals of different channels can be separated by the Fourier transformation because of their different frequency bands. In any case, the number of A/D converters can be reduced significantly as compared with the conventional apparatus, and a more compact and less expensive apparatus can be built.

The foregoing circuit configuration may be altered such that the output signals of the amplifiers 2-1, 2-2 and 2-3 are rendered the analog-to-digital conversion immediately. In this case, the digital filtering technique can be used.

Through the provision of a third filtering means which filters the signal following the filtering and hybridizing processes, arbitrary weights can be applied to the signal components, and it provides an increased latitude of hybridizing for the image signals for the achievement of a uniform image output. A digital filter can be used for the third filtering means.

Figure 4:
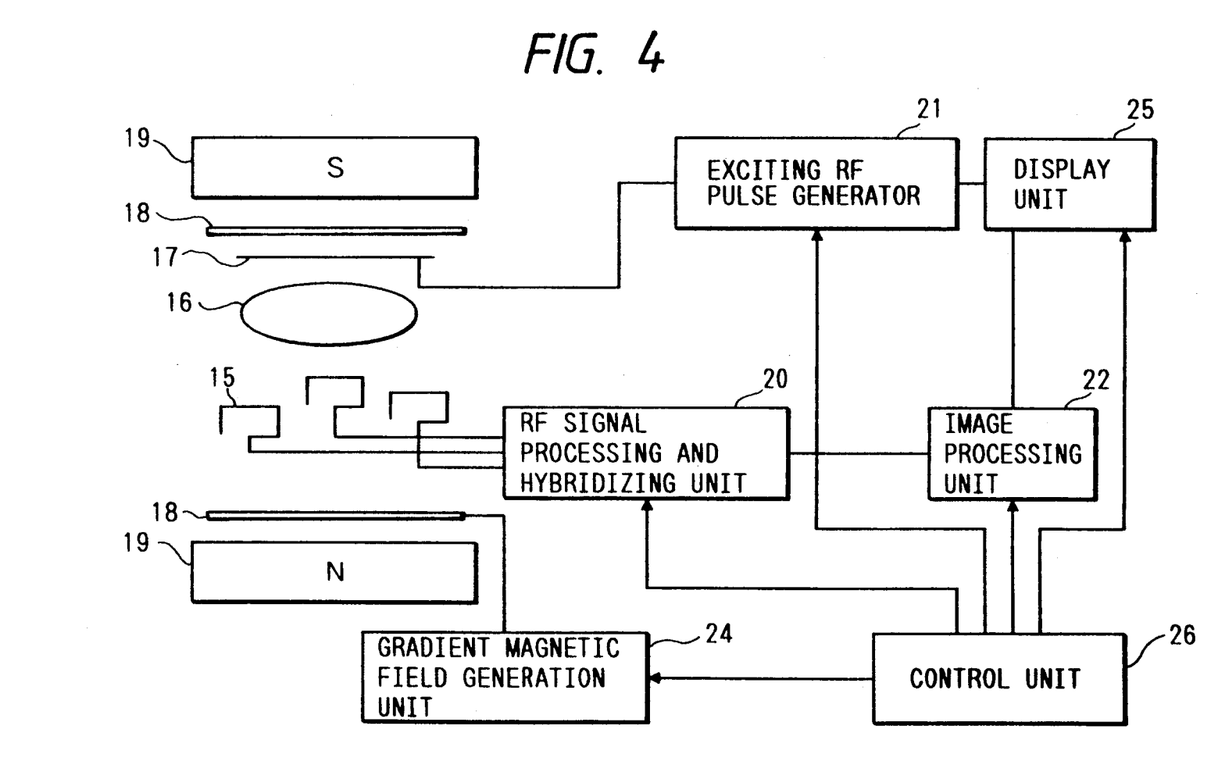
FIG. 4 is a block diagram showing the overall arrangement of the magnetic resonance apparatus based on the embodiment.

Next, control of the local oscillator and band-pass filters will be explained with reference to FIG. 4 which shows the overall arrangement of the magnetic resonance apparatus of the vertical magnetic field type based on this embodiment. An object 16 under test is placed in the vertical static magnetic field, produced by a magnet 19. A gradient magnetic field coil 18, which is driven by a gradient magnetic field generator 24, provides the static magnetic field with a sloped intensity. An excitation RF coil 17, which is driven by an excitation RF pulse generator 21, produces an RF magnetic field which acts on the object. The RF probe 15 made up of multiple coils receives RF magnetic field signals (magnetic resonance signals) from the object. These signals are hybridized by the RF signal hybridizing processor 20 which consists of the functional blocks 1 through 14 and 40 in FIG. 1, and, after the resulting signal has been processed the image reconstruction and compensation processes by a signal processor 22, an MR image (MRI, MRS, MRIS, etc.) is displayed on a display unit 25. The static magnetic field generator 23, gradient magnetic field generator 24, excitation RF pulse generator 21, RF signal hybridizing processor 20, signal processor 22, and display unit 25 are controlled by a controller 26.

The controller 26 operates to optimize the operational parameter in dealing with the gradient magnetic field and RF signals, as mentioned previously. Namely, the intensity of gradient magnetic field is determined depending on factors external to the filters, e.g., the imaging sequence, imaging speed and view field, and accordingly it is possible to set the parameters of the RF signal processor mentioned above, e.g., the band width of band-pass filters, center frequencies and output frequency of the local oscillator, arbitrarily in response to the selected gradient magnetic field intensity and view field. In this case, variable-band filters are used, or more than one filter is provided for each channel and operated selectively.

Figure 5:
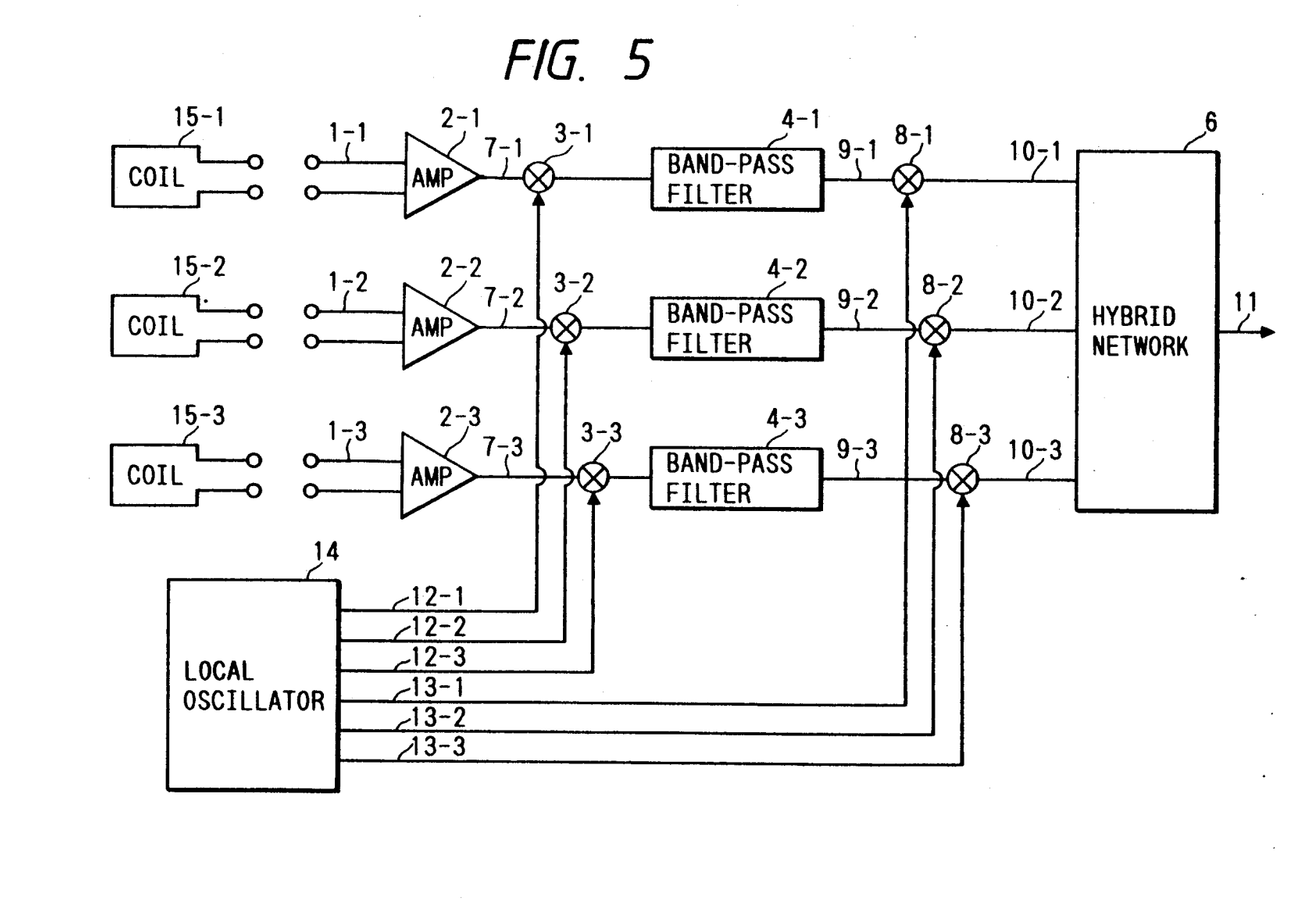
FIG. 5 is a block diagram showing another embodiment of this invention.

FIG. 5 shows another embodiment of the RF signal hybridizing processor 20. In this embodiment, the multi-channel NMR signals, which have been converted to the secondary frequencies by the frequency converters 3-1, 3-2 and 3-3 and rid of noises by the band-pass filters 4-1, 4-2 and 4-3, are further converted to ternary frequencies by means of second frequency converters 8-1, 8-2 and 8-3. With the NMR signals having center frequencies of 8.9574 MHz, 8.50000 MHz and 8.50425 MHz, the reference signals 12-1, 12-2 and 12-3 fed to the frequency converters 3-1, 3-2 and 3-3 are 7.49575 MHz, 7.50000 MHz and 7.50425 MHz, respectively, and accordingly the output signals of the frequency converters 3-1, 3-2 and 3-3 have a same center frequency of 1 MHz. The band-pass filters 4-1, 4-2 and 4-3 have a band width which is the same or slightly wider than that (4.25 kHz) of the NMR signals, with its center frequency being set to 1 MHz.

The second frequency converters 8-1, 8-2 and 8-3 are supplied with reference signals 13-1, 13-2 and 13-3 having frequencies of 27.49575 MHz, 27.50000 MHz and 27.50425 MHz, respectively, for example. The frequency converters 8-1, 8-2 and 8-3 incorporate low-pass filters for eliminating components of summed frequencies, and consequently the outputs 10-1, 10-2 and 10-3 of the frequency converters have center frequencies 26.49575 MHz, 26.50000 MHz and 26.50425 MHz, respectively. The signals converted to the ternary frequencies are summed in analog fashion by a hybrid network 6, and the resulting output 11 is fed to quadrature phase detector as in the case of FIG. 1, or it is converted into a digital signal and delivered to the signal processor 22 of FIG. 4.

This circuit configuration, in which the signals are once converted to lower frequencies so as to remove noise components outside the respective signal frequency bands with band-pass filters, enables the effective elimination of unwanted frequency components even though there is no difference of frequency among channels after conversion. The signals have their frequency converted to separate lower frequencies at the time of summation.

The signals 10-1, 10-2 and 10-3 to be summed by the hybrid network 6 have a shift of center frequencies identical to that of the original NMR signals 7-1, 7-2 and 7-3. By setting the frequencies of signals to be summed in this fashion, the signal processor 22 which implements various NMR image processings does not necessitate any special hybridizing process. In another case where the signals 9-1, 9-2 and 9-3 have a shift of center frequencies made greater than that of the original NMR signals 7-1, 7-2 and 7-3, three spatially separated NMR images will be created if processed intact, and therefore the signal processor 22 needs a hybridizing process for making these images coincident. This hybridizing process may be conducted in the space frequency domain prior to the Fourier transformation. From the viewpoint of achieving a higher s/n ratio through the noise elimination, the embodiment of FIG. 1, which contemplates widening the center frequency interval thereby to remove signal frequencies of other channels together, is much advantageous. In the case of the dual frequency conversion as shown in FIG. 5, it is desirable to provide a sufficient difference among the original frequencies (primary frequencies), secondary frequencies and ternary frequencies so that signals do not interfere across these frequency bands.

Figure 6:
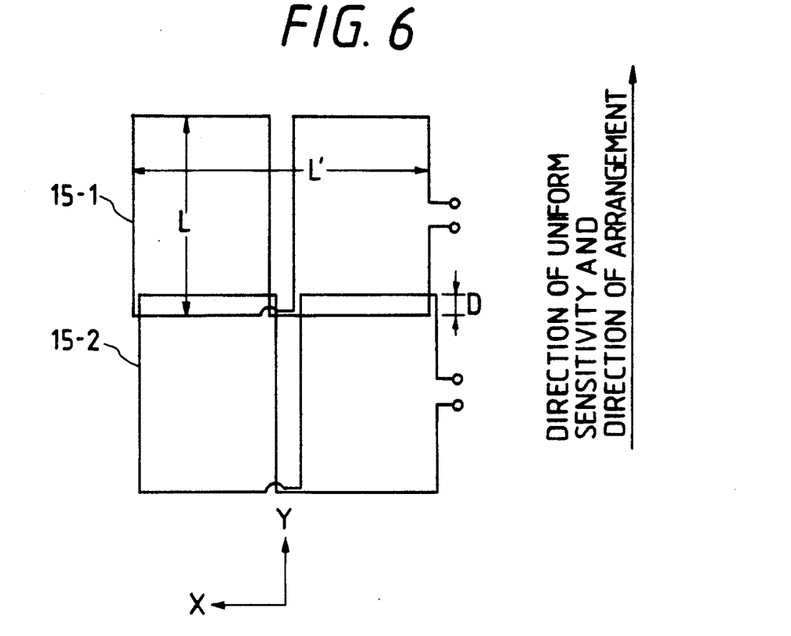
FIG. 6 is a plan view showing the arrangement of coils which constitute the RF probe used in the above embodiments.

FIG. 6 shows an example of the RF probe which can be used for the foregoing embodiments. This probe is a set of phased array coils intended for magnetic resonance apparatus of the vertical magnetic field type, with multiple surface coils 15-1 and 15-2 being arranged such that they overlap partially as shown in the figure. Each surface coil is sensitive to a magnetic field parallel to the coil surface.

Figure 7:
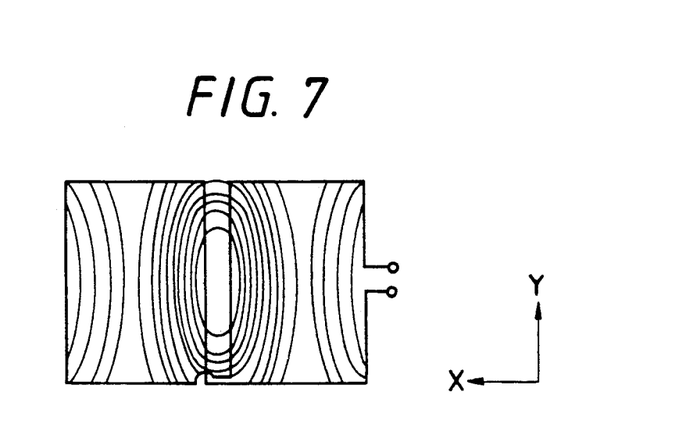
FIG. 7 is a conceptual diagram showing the sensitivity distribution of unit coils of the RF probe.

FIG. 7 shows the distribution of sensitivity, revealing that it is virtually constant in one direction (y direction) and it changes significantly in the perpendicular direction (x direction) as shown by the contour lines. A number of surface coils having the abovementioned sensitivity distribution are arranged along the y direction of the virtually constant sensitivity, and an RF probe having an extended view field in the y direction is configured. The surface coils 15-1 and 15-2 have a minimum mutual coupling when the overlap distance D is about 12 mm for the coil dimensions of L=170 mm in the y direction and L'=270 mm in the x direction.

Figure 8:
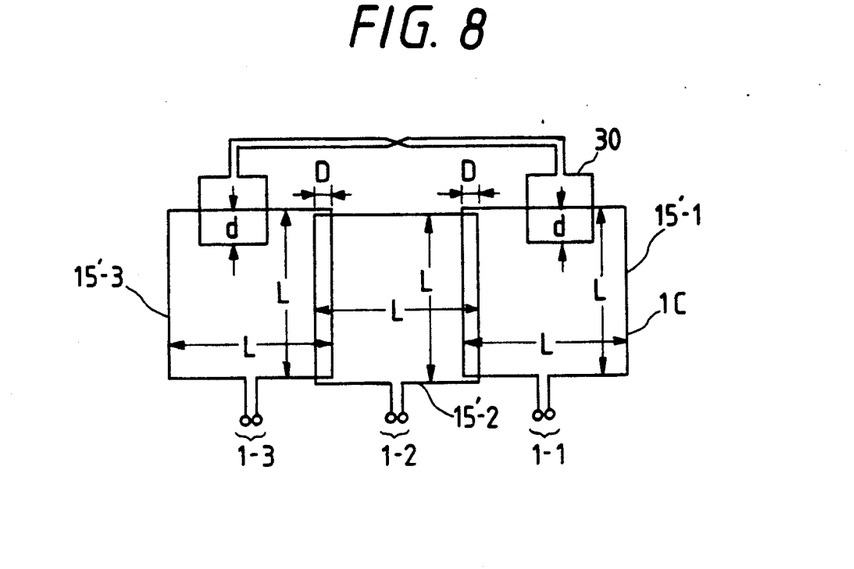
FIG. 8 is a plan view showing the arrangement of coils which constitute the RF probe used in another embodiment.

FIG. 8 shows an example of phased array coils used for magnetic resonance apparatus of the horizontal magnetic field type. Individual surface coils 15'-1, 15'-2 and 15'-3 have the sensitivity in the direction normal to the coil surface. The surface coils are arranged such that adjoining ones partially overlap, and the overlap distance D is determined so that adjoining surface coils have a minimal mutual coupling, as in the previous embodiment. For a square coil with a side length of L=100 mm, the value D is about 10 mm.

Figure 9A:
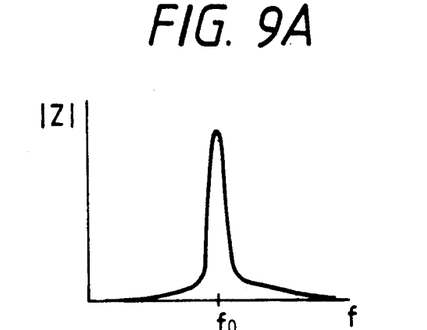
FIGS. 9A through 9D are characteristic diagrams showing the enhancement of resonance characteristics of the RF probe.
Figure 9B:
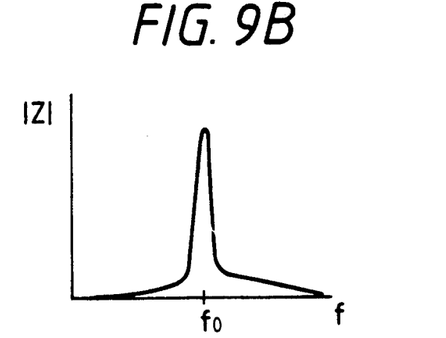
Figure 9C:
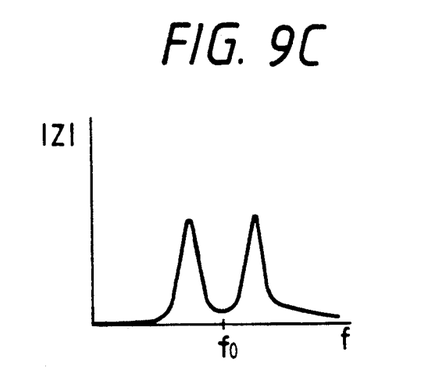

This overlap arrangement, however, cannot remove the mutual coupling between the surface coils 15'-1 and 15'-3. The surface coils 15'-1 and 15'-3 by themselves have individual resonance characteristics shown in FIGS. 9A and 9B, and have the same resonance frequency $f_0$. With the surface coils being arranged as shown in FIG. 8, the resonance characteristics observed on the signal output port 1-1 or 1-3 have resonation split into two peaks on both sides of $f_0$ as shown in FIG. 9C. In this conditions a noise received by one coil is propagated to another coil, and the reception output has a degraded s/n ratio. To cope with this matter, the phased array coils of FIG. 8 is provided with compensation coils 30 which picks up a magnetic flux produced by one surface coil and applies it by inverting the polarity to another surface coil so that their mutual coupling is cancelled out.

Figure 9D:
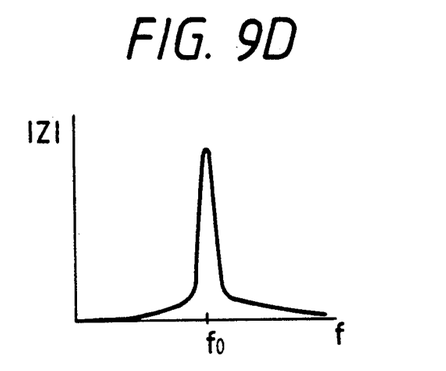

By setting a proper overlap distance d between the compensation coils 30 and the surface coils 15'-1 and 15'-3 so that the mutual coupling of these coils is removed, the resonance characteristics observed on the signal output port 1-1 or 1-3 can be modified as shown in FIG. 9D. This coil arrangement has resonation at the same resonance frequency $f_0$ as of the individual surface coil, and its output has an s/n ratio identical to that of the individual surface coil.

Figure 10:
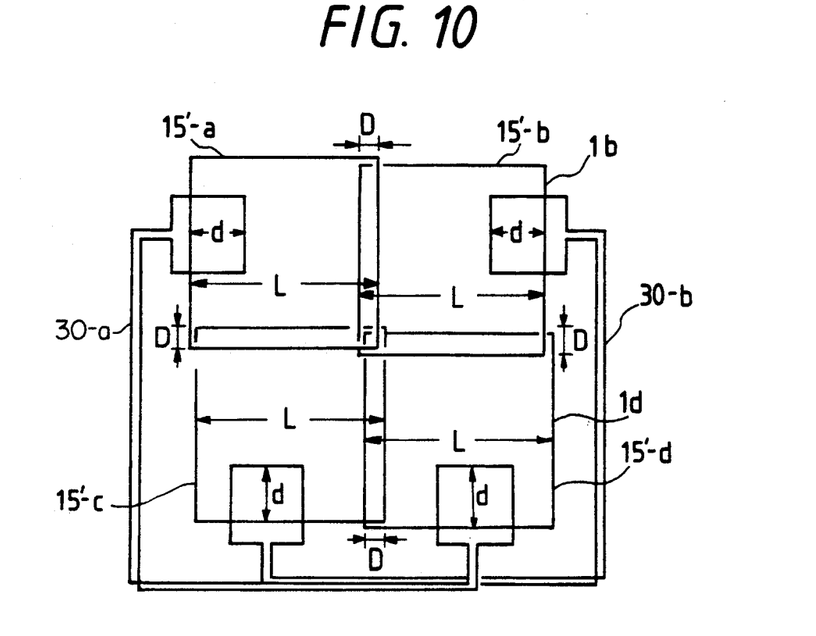
FIG. 10 is a plan view showing the arrangement of coils of another RF probe.

FIG. 10 shows another example of phased array coils. The phased array coils are a 2-dimensional array of four surface coils 15'-a, 15'-b, 15'-c and 15'-d. The overlap relation of adjoining surface coils is completely identical to the previous example of FIG. 8. Overlapping with a distance of D cannot dissolve the mutual coupling between the diagonally adjoining surface coils. Therefore, compensation coils 30-a and 30-b are provided for removing the mutual coupling between the surface coils 15'-a and 15'-d and the mutual coupling between the surface coils 15'-c and 15'-b, respectively.

Figure 11:
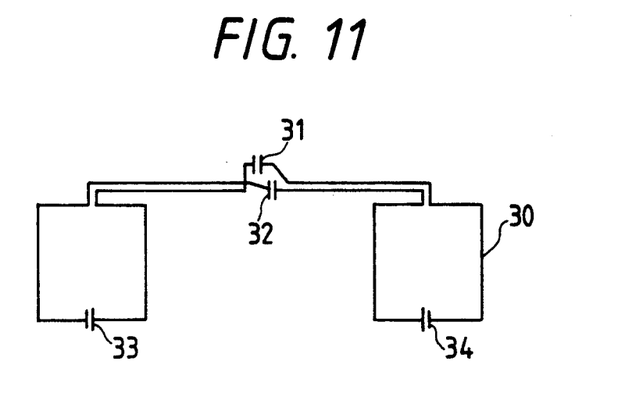
FIG. 11, FIG. 12 and FIG. 13 are schematic diagrams showing variants of the compensation coils used in the above RF probes.
Figure 12:
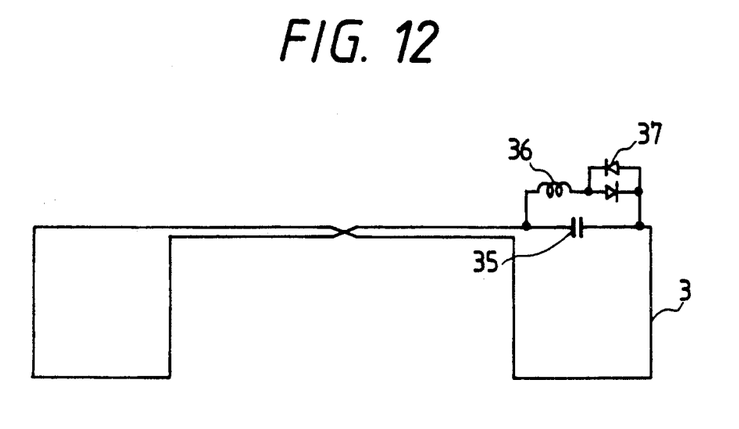
Figure 13:
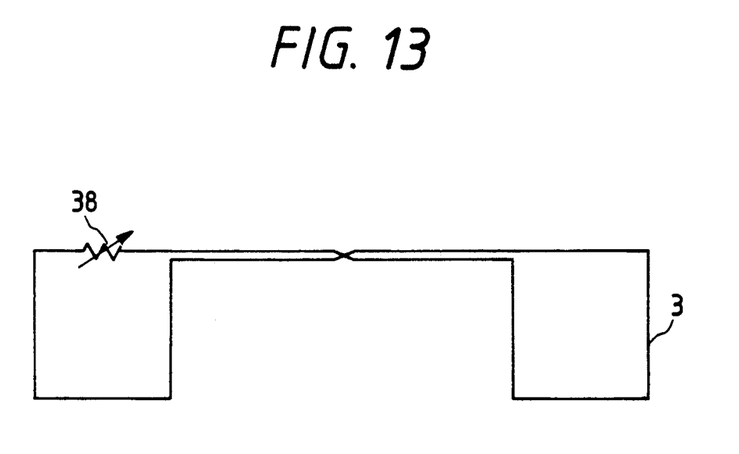

FIG. 11, FIG. 12 and FIG. 13 show examples of compensation coils which can be used for the phased array coils shown in FIG. 8 and FIG. 10. The compensation coils shown in FIG. 11 have their coil conductor divided into four sections by capacitors 31, 32, 33 and 34, thereby forming an LC resonance system. The compensation coils of FIG. 12 include a parallel resonance circuit made up of a capacitor 35 and an inductor 36 inserted midway the coil conductor. The inductor 36 has a serial connection of crossed-diode pair 37. The parallel resonance circuit has its resonance frequency set equal to the frequency of the RF magnetic field of the magnetic resonance apparatus.

During the period when a RF magnetic field is applied to the object by the excitation RF coil (indicated by 17 in FIG. 4), the crossed-diode pair 37 is conductive, causing the parallel resonance circuit to have an increased impedance due to resonation, and the compensation coils 30 are virtually open-circuitted. Consequently, the coupling between the excitation RF coil and compensation coils 30 dissolves. During the period of NMR signal reception from the object, the crossed-diode pair 37 are nonconductive because of too small forward voltage, and the parallel resonance circuit does not resonate. Consequently, the compensation coils 30 operate to remove the mutual coupling among the surface coils as described above.

Compensation coils shown in FIG. 13 have a variable resistor 38 inserted midway the coil conductor. The variable resistor 38 enables the adjustment of the current flowing in the compensation coils 30, allowing a proper compensation even if the overlap distance d between the compensation coils 30 and surface coils is fixed.

The signal hybridizing technique for multiple coils described above is not confined to phased array coils in the form of the arrangement of surface coils, but it is also applicable to other RF probes having multiple output ports.

Figure 14:
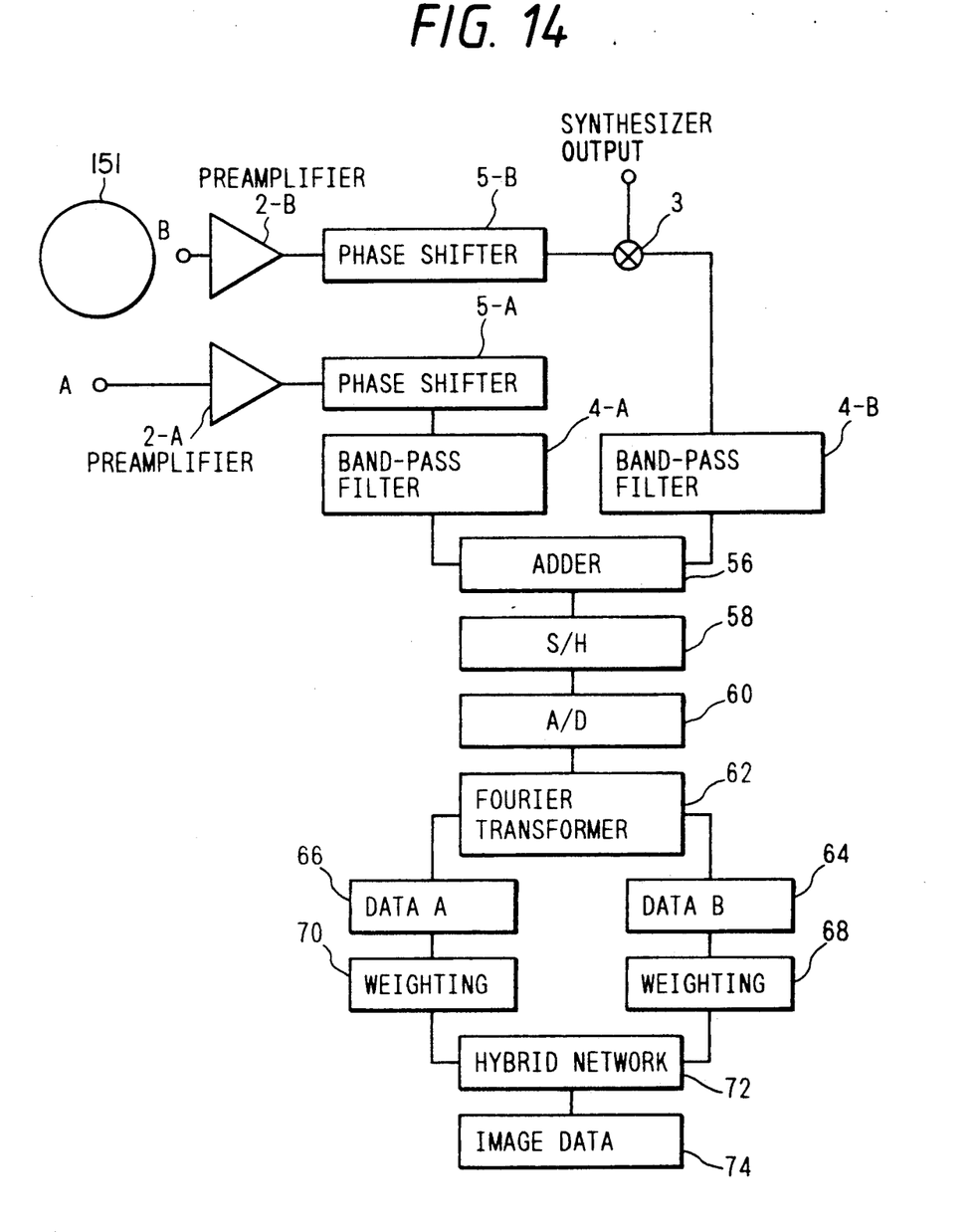
FIG. 14 is a block diagram showing still another embodiment of this invention.

FIG. 14 shows an embodiment of this invention applied to the signal hybridizing of a quadrature detection (QD) probe. A QD probe 151 has outputs on ports A and B, which are out of phase from each other by 90°. These output signals are amplified by the respective pre-amplifiers 2-A and 2-B, and thereafter the signals are finely adjusted to have an exact 90° phase difference by the respective phase shifters 5-A and 5-B.

The output signals on both ports have the same frequency band which is determined from the view field of NMR image and the intensity of gradient magnetic field. One output, i.e., the signal of the B port in this embodiment, is fed through a frequency converter 3 made up of a mixer and band-pass filter. The A port signal and the frequency-converted B port signal are fed through the respective band-pass filters 4-A and 4-B with the intention of noise elimination outside their signal bands. The resulting signals coming out of the band-pass filters 4-A and 4-B are hybridized by an adder 56. The hybridizing process may be of fixed weighting based on resistors, for example.

The hybridized signal is treated by a sample-holding circuit 58 and A/D converter 60, and then by a Fourier transformer 62. The signals of ports A and B appear in different frequency bands after the Fourier transformation, and therefore they can readily be separated. Separated data 64 and 66 of both ports are weighted by using weight function Ga(kz) and Gb(kz) on weighting calculators 68 and 70, respectively. A hybrid network 72 implements phase shift for the B data so that it moves to the same frequency band as the A data, and hybridizes these data to produce image data 74.

Since this embodiment implements A/D conversion after the signals of both ports have been hybridized, it can have a simpler and smaller-scale detection system. Another advantage is easy application of orthogonal phase detection. The QD probe of this type possesses the multi-port signals in separate states in terms of frequency even after A/D conversion, allowing the signals to be hybridized after they are processed in the process of arbitrary weighting and phase adjustment individually in the form of crude data or image data, whereby a uniform image can be produced easily.

According to the inventive nuclear magnetic resonance apparatus for producing an NMR image from object RF signals provided by a multi-channel RF probe, the detected signals are converted into multiple frequency bands which do not virtually overlap, the resulting signals are filtered by the individual band-pass filters, and thereafter the filtered signals are hybridized. Consequently, the signals and noises can surely be separated, and the hybridized signal retains a satisfactory s/n ratio.

What we claim is:

1. A nuclear magnetic resonance apparatus comprising:
   an RF probe which receives nuclear magnetic resonance signals emitted by an object under test and outputs the received signals through output terminals of multiple channels;
   a plurality of frequency converters which implement frequency conversion for the signals supplied from the output terminals of said RF probe such that the converted signals have different center frequencies among the channels;
   a plurality of band-pass filters each of which is connected to the output of one of said frequency converters and adapted to eliminate signals having frequencies outside the respective signal frequency bands;
   a signal hybridizing circuit which sums the outputs of said band-pass filters thereby to produce a hybridized signal; and
   a signal processor which receives the hybridized signal and implements a signal processing for producing a nuclear magnetic resonance image from the hybridized signal.

2. A nuclear magnetic resonance apparatus according to claim 1, wherein said frequency converters implement down-frequency conversion for the signals of multiple channels supplied by said RF probe.

3. A nuclear magnetic resonance apparatus according to claim 1, wherein said signal processor includes means of implementing analog-to-digital conversion for the hybridized signal.

4. A nuclear magnetic resonance apparatus according to claim 1, wherein said signal processor includes a quadrature phase detector which implements quadrature phase detection for the hybridized signal to produce a real-part signal and an imaginary-part signal.

5. A nuclear magnetic resonance apparatus comprising:
   an RF probe including an array of coils for receiving nuclear magnetic resonance signals emitted by an object under test placed in a space to which a prescribed static magnetic field is applied;
   gradient magnetic field generation means for causing the static magnetic field to have a gradient of intensity;
   a plurality of frequency converters which implement frequency conversion for the nuclear magnetic resonance signals of multiple channels provided by said coils such that the converted signals of multiple channels have a center frequency interval greater than a center frequency interval of the coil output signals which are produced by the gradient of intensity of the static magnetic field;
   a plurality of band-pass filters each of which is connected to the output of one of said frequency converters and adapted to eliminate signals having frequencies outside the respective signal frequency bands;
   a signal hybridizing circuit which sums the outputs of said band-pass filters thereby to produce a hybridized signal; and
   a signal processor which receives the hybridized signal and implements a signal processing for producing a nuclear magnetic resonance image from the hybridized signal.

6. A nuclear magnetic resonance apparatus according to claim 5, wherein said frequency converters implement down-frequency conversion for the signals of multiple channels supplied by said RF probe.

7. A nuclear magnetic resonance apparatus according to claim 5, wherein said frequency converters implement frequency conversion for the signals of multiple channels supplied by said RF probe such that the converted signals have frequency bands which do not virtually overlap, each of said band-pass filters operating to cut off virtually at least the frequency bands of signals of other channels.

8. A nuclear magnetic resonance apparatus according to claim 5, wherein said RF probe comprises a plurality of coils having a virtually equal sensitivity of detection along a first direction and having greatly different sensitivities of detection in a second direction perpendicular to the first direction, said coils being arranged along the first direction such that adjoining coils partially overlap.

9. A nuclear magnetic resonance apparatus according to claim 5, wherein said RF probe comprises a plurality of coils arranged such that adjoining coils partially overlap, and a compensation coil which operates for a pair of coils which do not adjoin to transfer the magnetic flux of one coil to another coil after inverting the polarity of magnetic flux.

10. A nuclear magnetic resonance apparatus comprising:
    an RF probe including an array of coils for receiving nuclear magnetic resonance signals emitted by an object under test placed in a space to which a prescribed static magnetic field is applied;
    gradient magnetic field generation means for causing the static magnetic field to have a gradient of intensity;

a plurality of first frequency converters which implement down-frequency conversion for the nuclear magnetic resonance signals of multiple channels provided by said coils;

a plurality of band-pass filters each of which is connected to the output of one of said first frequency converters and adapted to eliminate signals having frequencies outside the respective signal frequency bands;

a plurality of second frequency converters which implement frequency conversion for the signals coming out of said band-pass filters such that the converted signals have different center frequencies among the channels;

a signal hybridizing circuit which sums the outputs of said second frequency converters thereby to produce a hybridized signal; and a signal processor which receives the hybridized signal and implements a signal processing for producing a nuclear magnetic resonance image from the hybridized signal.

11. A nuclear magnetic resonance apparatus according to claim 10, wherein said RF probe comprises a plurality of coils having a virtually equal sensitivity of detection along a first direction and having greatly different sensitivities of detection in a second direction perpendicular to the first direction, said coils being arranged along the first direction such that adjoining coils partially overlap.

12. A nuclear magnetic resonance apparatus according to claim 10, wherein said RF probe comprises a plurality of coils arranged such that adjoining coils partially overlap, and a compensation coil which operates for a pair of coils which do not adjoin to transfer the magnetic flux of one coil to another coil after inverting the polarity of magnetic flux.

13. A nuclear magnetic resonance apparatus comprising:

an RF probe which receives nuclear magnetic resonance signals emitted by an object under test and outputs the received signals having a phase difference of about 90° through a first and second output terminals;

a frequency converter which implements frequency conversion for the signal supplied from said first output terminal such that the converted signal has a signal frequency band which does not virtually overlap on the frequency band of the signal supplied from said second output terminal;

a plurality of band-pass filters which receive the output signal of said frequency converter and the signal from said second terminal, respectively, and operate to eliminate signals having frequencies outside the respective signal frequency bands;

a signal hybridizing circuit which sums the outputs of said band-pass filters thereby to produce a hybridized signal; and a signal processor which receives the hybridized signal and implements a signal processing for producing a nuclear magnetic resonance image from the hybridized signal.

14. A nuclear magnetic resonance apparatus according to claim 13, wherein said signal processor comprises means of implementing analog-to-digital conversion for the hybridized signal; means of implementing Fourier transformation for the output of said analog-to-digital conversion means; and means of hybridizing output data appearing in two modes in the output of said Fourier transformation means after applying weights to both output data.

15. A nuclear magnetic resonance apparatus comprising:

an RF probe which receives nuclear magnetic resonance signals emitted by an object under test and outputs the received signals through output terminals of multiple channels;

a plurality of frequency converters which implement frequency conversion for the signals supplied from the output terminals of said RF probe such that the converted signals have different center frequencies among the channels;

a plurality of filters each of which is connected to the output of one of said frequency converters and adapted to eliminate signals having frequencies outside the respective signal frequency bands of said filters;

a signal hybridizing circuit which sums the outputs of said filters thereby to produce a hybridized signal; and a signal processor which receives the hybridized signal and implements a signal processing for producing a nuclear magnetic resonance image from the hybridized signal.

16. A nuclear magnetic resonance apparatus according to claim 15, wherein said frequency converters implement down-frequency conversion for the signals of multiple channels supplied by said RF probe.

17. A nuclear magnetic resonance apparatus according to claim 15, wherein said signal processor includes means of implementing analog-to-digital conversion for the hybridized signal.

18. A nuclear magnetic resonance apparatus according to claim 15, wherein said signal processor includes a quadrature phase detector which implements quadrature phase detection for the hybridized signal to produce a real-part signal and an imaginary-part signal.

19. A nuclear magnetic resonance apparatus comprising:

an RF probe including an array of coils for receiving nuclear magnetic resonance signals emitted by an object under test placed in a space to which a prescribed static magnetic field is applied;

gradient magnetic field generation means for causing the static magnetic field to have a gradient of intensity;

a plurality of frequency converters which implement frequency conversion for the nuclear magnetic resonance signals of multiple channels provided by said coils such that the converted signals of multiple channels have a center frequency interval greater than a center frequency interval of the coil output signals which are produced by the gradient of intensity of the static magnetic field;

a plurality of filters each of which is connected to the output of one of said frequency converters and adapted to eliminate signals having frequencies outside the respective signal frequency bands of said filters;

a signal hybridizing circuit which sums the outputs of said filters thereby to produce a hybridized signal; and a signal processor which receives the hybridized signal and implements a signal processing for producing a nuclear magnetic resonance image from the hybridized signal.

20. A nuclear magnetic resonance apparatus according to claim 19, wherein said frequency converters implement down-frequency conversion for the signals of multiple channels supplied by said RF probe.

21. A nuclear magnetic resonance apparatus according to claim 19, wherein said frequency converters implement frequency conversion for the signals of multiple channels supplied by said RF probe such that the converted signals have frequency bands which do not virtually overlap, each of said filters operating to cut off virtually at least the frequency bands of signals of other channels.

22. A nuclear magnetic resonance apparatus according to claim 19, wherein RF probe comprises a plurality of coils having a virtually equal sensitivity of detection along a first direction and having greatly different sensitivities of detection in a second direction perpendicular to the first direction, said coils being arranged along the first direction such that adjoining coils partially overlap.

23. A nuclear magnetic resonance apparatus according to claim 19, wherein RF probe comprises a plurality of coils arranged such that adjoining coils partially overlap, and a compensation coil which operates for a pair of coils which do not adjoin to transfer the magnetic flux of one coil to another coil after inverting the polarity of magnetic flux.

24. A nuclear magnetic resonance apparatus comprising:
   an RF probe including an array of coils for receiving nuclear magnetic resonance signals emitted by an object under test placed in a space to which a prescribed static magnetic field is applied;
   gradient magnetic field generation means for causing the static magnetic field to have a gradient of intensity;
   a plurality of first frequency converters which implement down-frequency conversion for the nuclear magnetic resonance signals of multiple channels provided by said coils;
   a plurality of filters each of which is connected to the output of one of said first frequency converters and adapted to eliminate signals having frequencies outside the respective signal frequency bands of said filters;
   a plurality of second frequency converts which implement frequency conversion for the signals coming out of said filters such that the converted signals have different center frequencies among the channels;
   a signal hybridizing circuit which sums the outputs of said second frequency converters thereby to produce a hybridized signal; and
   a signal processor which receives the hybridized signal and implements a signal processing for producing a nuclear magnetic resonance image from the hybridized signal.

25. A nuclear magnetic resonance apparatus according to claim 24, wherein said RF probe comprises a plurality of coils having a virtually equal sensitivity of detection along a first direction and have greatly different sensitivities of detection in a second direction perpendicular to the first direction, said coils being arranged along the first direction such that adjoining coils partially overlap.

26. A nuclear magnetic resonance apparatus according to claim 24, wherein said RF probe comprises a plurality of coils arranged such that adjoining coils partially overlap, and a compensation coil which operates for a pair of coils which do not adjoin to transfer the magnetic flux of one coil to another coil after inverting the polarity of magnetic flux.

27. A nuclear magnetic resonance apparatus comprising:
   an RF probe which receives nuclear magnetic resonance signals emitted by an object under test and outputs the received signals having a phase difference of about 90° through a first and second output terminals;
   a frequency converter which implements frequency conversion for the signal supplied from said first output terminal such that the converted signal has a signal frequency band which does not virtually overlap on the frequency band of the signal supplied from said second output terminal;
   a plurality of filters which receive the output signal of said frequency converter and the signal from said second terminal, respectively, and operate to eliminate signals having frequencies outside the respective signal frequency bands of said filters;
   a signal hybridizing circuit which sums the outputs of said filters thereby to produce a hybridized signal; and
   a signal processor which receives the hybridized signal and implements a signal processing for producing a nuclear magnetic resonance image from the hybridized signal.

28. A nuclear magnetic resonance apparatus according to claim 27, wherein said signal processor comprises means of implementing analog-to-digital conversion for the hybridized signal; means of implementing Fourier transformation for the output of said analog-to-digital conversion means; and means of hybridizing output data appearing in two modes of the output of said Fourier transformation means after applying weights to both output data.

* * * * *